(12) United States Patent
Abdo

(10) Patent No.: US 10,686,115 B2
(45) Date of Patent: Jun. 16, 2020

(54) FOUR-PORT CIRCULATOR WITH FREQUENCY CONVERSION BASED ON NONDEGENERATE THREE WAVING MIXING JOSEPHSON DEVICES

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/245,425

(22) Filed: Jan. 11, 2019

(65) Prior Publication Data
US 2019/0165239 A1    May 30, 2019

Related U.S. Application Data

(63) Continuation of application No. 15/490,464, filed on Apr. 18, 2017, now Pat. No. 10,230,038.

(51) Int. Cl.
| H01L 39/02 | (2006.01) |
| H01P 5/12 | (2006.01) |
| H01P 1/38 | (2006.01) |
| H01L 39/24 | (2006.01) |
| H03D 7/00 | (2006.01) |
| B82Y 40/00 | (2011.01) |

(52) U.S. Cl.
CPC ........ *H01L 39/025* (2013.01); *H01L 39/2493* (2013.01); *H01P 1/38* (2013.01); *H01P 5/12* (2013.01); *H03D 7/005* (2013.01); *B82Y 40/00* (2013.01)

(58) Field of Classification Search
CPC ......... H01P 1/38; H03D 7/005; H01L 39/025; H01L 39/22; H01L 39/221; H01L 39/223; H01L 39/225; H01L 39/226; H01L 39/228
USPC ................................................. 327/367, 528
See application file for complete search history.

(56) References Cited

U.S. PATENT DOCUMENTS

| 4,896,374 A | 1/1990 | Waugh et al. |
| 5,493,719 A | 2/1996 | Smith et al. |
| 6,154,026 A | 11/2000 | Dantsker et al. |

(Continued)

FOREIGN PATENT DOCUMENTS

WO    2016138406 A1    9/2016

OTHER PUBLICATIONS

Abdo, B., et al, "Directional Amplification with a Josephson Circuit", Physical Review X, American Physical Society, Jul. 1, 2013 (Year: 2013).*

(Continued)

*Primary Examiner* — Tomi Skibinski
(74) *Attorney, Agent, or Firm* — Cantor Colburn LLP; Vazken Alexanian

(57) ABSTRACT

A technique relates to a superconducting device. A first mixing device has a first mixing port and a second mixing port. A second mixing device has another first mixing port and another second mixing port. The first and second mixing devices are superconducting nondegenerate three-wave mixing devices. The first mixing port and the another first mixing port are configured to couple to a first coupler. The second mixing port and the another second mixing port are configured to couple to a second coupler.

20 Claims, 15 Drawing Sheets

(56) References Cited

U.S. PATENT DOCUMENTS

| | | |
|---|---|---|
| 6,643,417 B2 | 11/2003 | Strutz et al. |
| 6,725,029 B1 | 4/2004 | Allen |
| 6,738,611 B1 | 5/2004 | Politi |
| 7,512,395 B2 | 3/2009 | Beukema et al. |
| 8,036,627 B2 | 10/2011 | Teillet et al. |
| 9,350,460 B2 | 5/2016 | Paik |
| 9,461,588 B1 | 10/2016 | Naaman et al. |
| 9,735,776 B1 | 8/2017 | Abdo et al. |
| 9,806,711 B1 | 10/2017 | Abdo |
| 2002/0179931 A1 | 12/2002 | Traylor |
| 2003/0159156 A1 | 8/2003 | Fulga et al. |
| 2004/0090286 A1* | 5/2004 | Runyon .................. H01P 5/04 333/117 |
| 2006/0105736 A1 | 5/2006 | Fujii |
| 2007/0194225 A1 | 8/2007 | Zorn |
| 2009/0086658 A1 | 4/2009 | Teillet et al. |
| 2011/0207420 A1 | 8/2011 | Rajendran et al. |
| 2012/0319685 A1 | 12/2012 | Burger |
| 2014/0314419 A1 | 10/2014 | Paik |
| 2015/0032993 A1 | 1/2015 | Amin et al. |
| 2016/0233860 A1 | 8/2016 | Naaman |
| 2016/0308502 A1 | 10/2016 | Abdo et al. |
| 2016/0380636 A1 | 12/2016 | Abdo |
| 2017/0039481 A1 | 2/2017 | Abdo |
| 2017/0093381 A1 | 3/2017 | Abdo |
| 2017/0201224 A1 | 7/2017 | Strong et al. |
| 2017/0300827 A1 | 10/2017 | Amin et al. |
| 2018/0301612 A1 | 10/2018 | Abdo |
| 2018/0301613 A1 | 10/2018 | Abdo |

OTHER PUBLICATIONS

List of IBM Patents or Patent Applications Treated As Related; (Appendix P), Date Filed: Jan. 29, 2019, 2 pages.

Abdo, et al., "Full coherent frequency conversion between two propagating microwave modes," Physical Review Letters, vol. 110, No. 17, 173902, 2013, pp. 1-5.

Abdo, et al., "Josephson amplifier for qubit readout," Applied Physics Letters, vol. 99, No. 16, 162506, 2011, pp. 1-3.

Abdo, et al., "Nondegenerate three-wave mixing with the Josephson ring modulator," Physical Review B, vol. 87, No. 1, 014508, 2013, pp. 1-18.

Abdo, et al., "Time-multiplexed amplification in a hybrid-less and coil-less Josephson parametric converter," Applied Physics Letters, A I Publishing LLC, US, vol. 110, No. 8, Feb. 21, 2017, 14 pages.

International Search Report and Written Opinion, International Application No. PCT/EP2017/081145, Filed Dec. 1, 2017, dated Feb. 12, 2018, 13 pages.

Pillet, et al., "A compact design for the Josephson mixer: The lumped element circuit", Applied Physics Letters, AIP Publishing, vol. 106, No. 22, Jun. 30, 2015, 5 pages.

Sliwa, et al., "Reconfigurable Josephson Circulator/Directional Amplifier," Physical Review X, vol. 5, No. 4, 041020, 2015, pp. 1-10.

\* cited by examiner

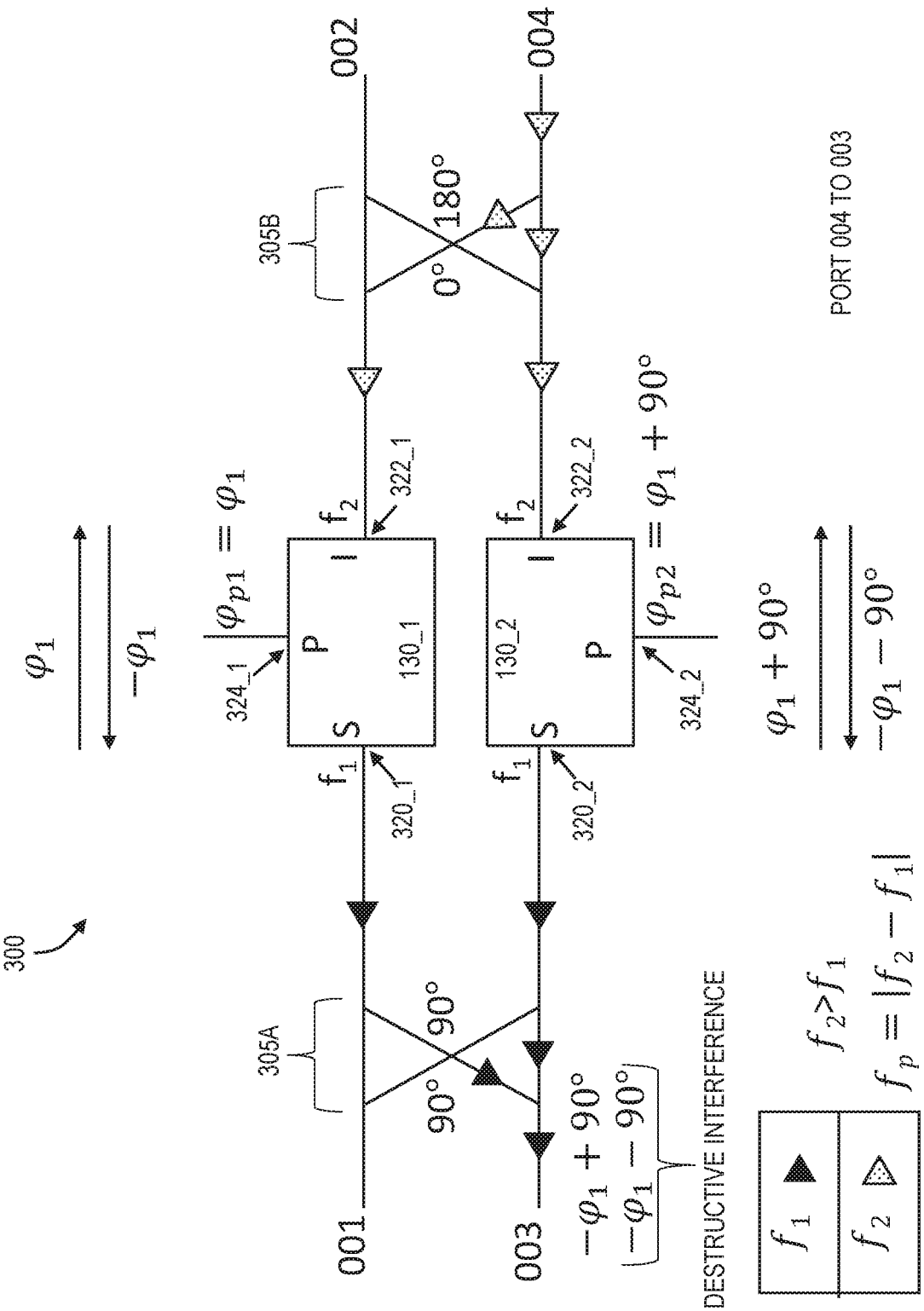

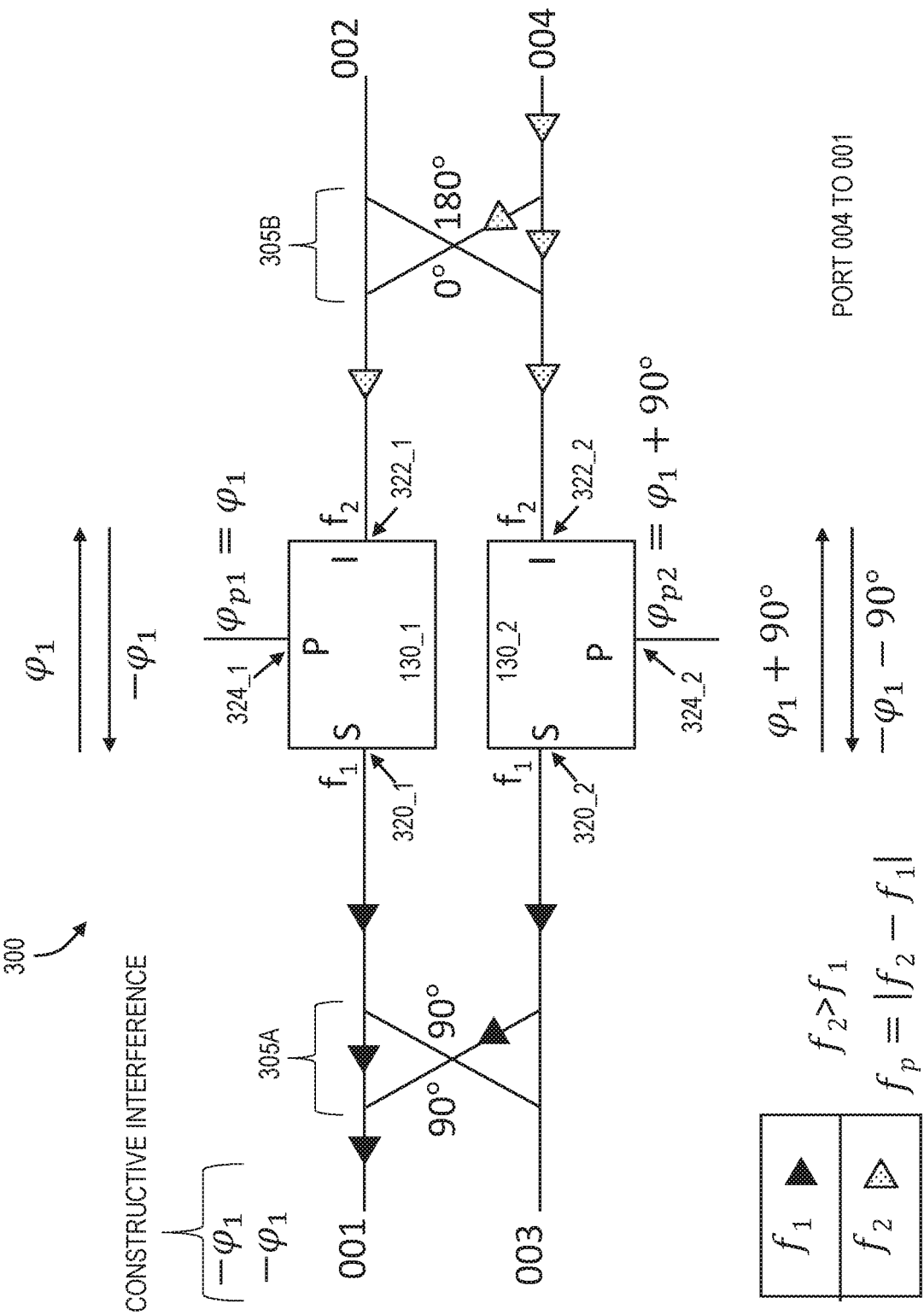

PROVIDE A FIRST MIXING DEVICE HAVING A FIRST MIXING PORT AND A SECOND MIXING PORT 1302

↓

PROVIDE A SECOND MIXING DEVICE HAVING ANOTHER FIRST MIXING PORT AND ANOTHER SECOND MIXING PORT, THE FIRST AND SECOND MIXING DEVICES BEING SUPERCONDUCTING NONDEGENERATE THREE-WAVE MIXING DEVICES 1304

↓

COUPLE THE FIRST MIXING PORT AND THE ANOTHER FIRST MIXING PORT TO A FIRST COUPLER 1306

↓

COUPLE THE SECOND MIXING PORT AND THE ANOTHER SECOND MIXING PORT TO A SECOND COUPLER 1308

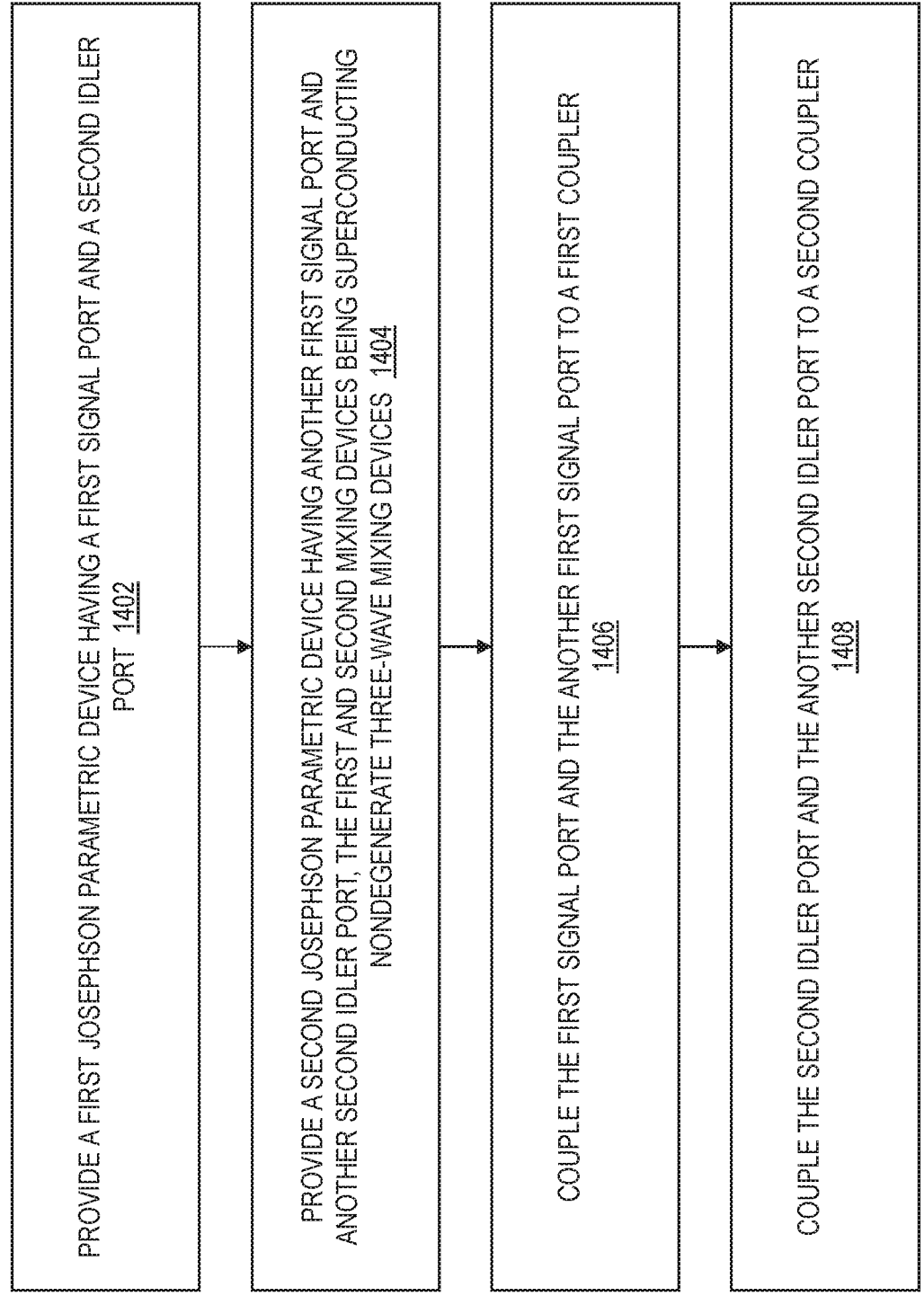

RECEIVE A SIGNAL AT A PORT OF A FIRST COUPLER, WHEREIN A FIRST JOSEPHSON PARAMETRIC DEVICE AND A SECOND JOSEPHSON PARAMETRIC DEVICE ARE COUPLED IN PARALLEL TO THE FIRST COUPLER AND A SECOND COUPLER  1502

OUTPUT THE SIGNAL AT SOME PORT OF THE SECOND COUPLER  1504

US 10,686,115 B2

FOUR-PORT CIRCULATOR WITH FREQUENCY CONVERSION BASED ON NONDEGENERATE THREE WAVING MIXING JOSEPHSON DEVICES

This application is a continuation of U.S. patent application Ser. No. 15/490,464, filed Apr. 18, 2017, the disclosure of which is incorporated by reference herein in its entirety.

BACKGROUND

The present invention generally relates to superconducting devices. More specifically, the present invention relates to four-port circulators with frequency conversion based on nondegenerate three-wave mixing Josephson devices.

A circulator is a passive nonreciprocal three-port or four-port device, in which a microwave or radio frequency signal entering any port is transmitted to the next port in rotation (only). A port in this context is a plane where an external waveguide or transmission line (such as a microstrip line or a coaxial cable) connects to the device. For a three-port circulator, a signal applied to port 1 only comes out of port 2. A signal applied to port 2 only comes out of port 3. A signal applied to port 3 only comes out of port 1. Within a phase-factor, the scattering matrix for an ideal frequency-preserving three-port circulator is $$S = \begin{pmatrix} 0 & 0 & 1 \\ 1 & 0 & 0 \\ 0 & 1 & 0 \end{pmatrix}.$$

Circulators are used in superconducting circuits.

SUMMARY

Embodiments of the present invention are directed to a superconducting device. A non-limiting example of the superconducting device includes a first mixing device having a first mixing port and a second mixing port, and a second mixing device having another first mixing port and another second mixing port. The first and second mixing devices are superconducting nondegenerate three-wave mixing devices, where the first mixing port and the another first mixing port are configured to couple to a first coupler, and where the second mixing port and the another second mixing port are configured to couple to a second coupler.

Embodiments of the present invention are directed to a method of forming a superconducting device. A non-limiting example of forming the superconducting device includes providing a first mixing device having a first mixing port and a second mixing port, and providing a second mixing device having another first mixing port and another second mixing port. The first and second mixing devices are superconducting nondegenerate three-wave mixing devices. The method includes coupling the first mixing port and the another first mixing port to a first coupler, and coupling the second mixing port and the another second mixing port to a second coupler.

Embodiments of the present invention are directed to a superconducting four-port circulator. A non-limiting example of the superconducting four-port circulator includes a first Josephson parametric device having a first signal port and a second idler port, and a second Josephson parametric device having another first signal port and another second idler port. The first and second mixing devices are superconducting nondegenerate three-wave mixing devices, where the first signal port and the another first signal port are configured to couple to a first coupler, and where the second idler port and the another second idler port are configured to couple to a second coupler.

Embodiments of the present invention are directed to a method of forming a superconducting four-port circulator. A non-limiting example of the method of forming the superconducting four-port circulator includes providing a first Josephson parametric device having a first signal port and a second idler port, and providing a second Josephson parametric device having another first signal port and another second idler port. The first and second mixing devices are superconducting nondegenerate three-wave mixing devices. Also, the method includes coupling the first signal port and the another first signal port to a first coupler, and coupling the second idler port and the another second idler port to a second coupler.

Embodiments of the present invention are directed to a method of operating a superconducting four-port circulator. A non-limiting example of the method of operating the superconducting four-port circulator includes receiving a signal at a port of a first coupler, where a first Josephson parametric device and a second Josephson parametric device are coupled in parallel to the first coupler and a second coupler. The method includes outputting the signal at a predefined port of the second coupler.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 11 depicts operation of a four-port circulator according to embodiments of the invention;

FIG. 12 depicts operation of a four-port circulator according to embodiments of the invention;

FIG. 13 depicts a flow chart of a method of forming a superconducting device according to embodiments of the invention;

FIG. 14 depicts a flow chart of a method of forming a superconducting four-port circulator according to embodiments of the invention; and FIG. 15 depicts a flow chart of a method of operating a superconducting four-port circulator according to embodiments of the invention.

Figure 1:
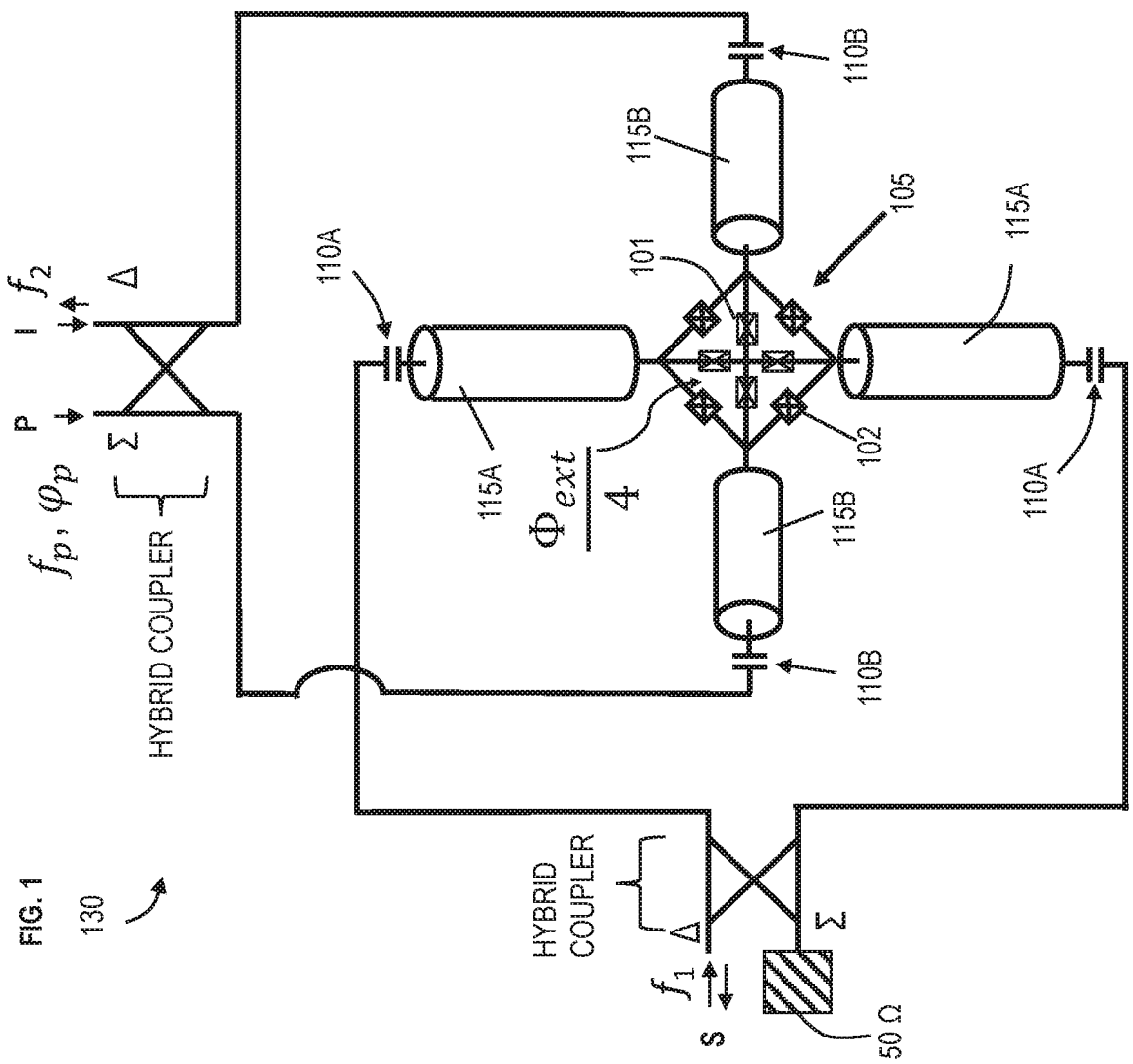
FIG. 1 depicts a schematic of a superconducting nondegenerate three-wave mixing device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, progress in solid-state quantum information processing has motivated the search for amplifiers and frequency converters with quantum-limited performance in the microwave domain. Depending on the gain applied to the quadratures of a single spatial and temporal mode of the electromagnetic field, linear amplifiers can be classified into two categories which are phase sensitive and phase preserving, each having fundamentally different noise properties. Phase-sensitive amplifiers squeeze the input noise and signal in one quadrature of the microwave field at the expense of inflating the noise and signal in the other quadrature without adding noise of their own to the processed signal. However, phase-sensitive amplifiers are useful only in cases in which the quantum information is encoded in one quadrature of the microwave field. A phase-preserving amplifier on the other hand amplifies both quadratures of the input noise and signal at the expense of adding at least a noise equivalent to a half input photon at the signal frequency. Such an amplifier would be useful in many quantum applications, including qubit readout. One realization of a nondegenerate intrinsically phase-preserving superconducting parametric amplifier is based on a Josephson ring modulator. A Josephson ring modulator can include four Josephson junctions in a Wheatstone bridge configuration. The device symmetry enhances the purity of the amplification process, i.e., eliminates or minimizes certain undesired nonlinear processes, and also simplifies both its operation and its analysis.

Commercial cryogenic circulators are utilized in quantum applications. However, commercial cryogenic circulators are typically large in size, heavy in weight, and hard to thermalize. Additionally, commercial cryogenic circulators use ferrites which are difficult to fabricate/integrate on chip and incorporate magnets which can have negative effects on superconducting circuits. In a standard 1 input 1 output line setup, which connects 1 qubit-resonator and 1 quantum-limited amplifier, such as the Josephson parametric converter (JPC), the state-of-the-art uses about two circulators and three isolators.

Turning now to an overview of the aspects of the invention, one or more embodiments of the invention address the above-described shortcomings of the prior art by providing superconducting nondegenerate three-wave mixing devices coupled together in parallel. More specifically, the above-described aspects of the invention address the shortcomings of the prior art by providing a superconducting four-port circulator with frequency conversion based at least in part on nondegenerate three-wave mixing Josephson devices. According to embodiments of the invention, the technical effects and benefits of the four-port circulator are that it can be integrated on chip or into a printed circuit board (PCB), does not use ferrites, and does not require magnets (with large magnetic fields). Also, the four-port circulator can be thermalized well, can be made small/compact, and has lighter weight. Further, the direction of isolation can be reversed in situ by negating the phase difference between the two pump tones feeding the two nondegenerate three-wave mixing devices. Further, embodiments allow for adding multiple four-port circulators (i.e., scaling up) on the same chip with high density.

Turning now to a more detailed description of aspects of the present invention, FIG. 1 depicts a schematic of a superconducting nondegenerate three-wave mixing device 130 according to embodiments of the invention. The superconducting nondegenerate three-wave mixing device 130 can be a Josephson parametric converter (as one example). The Josephson parametric converter 130 includes a Josephson ring modulator (JRM) 105 which is a nonlinear dispersive element based on Josephson tunnel junctions 102 that can perform three-wave mixing of microwave signals at the quantum limit. The three microwave signals are generally referred to as the Signal microwave signal, Idler microwave signal, and Pump microwave signal. The JRM 105 consists of four nominally identical Josephson junctions 102 arranged in a Wheatstone bridge configuration. The JRM 105 can also include four nominally identical Josephson junction 101 connected at the intersections of the Josephson junction 102. In some implementations, the Josephson junctions 101 can be identical to the Josephson junction 102. In other implementations, the Josephson junction 101 can be different from the Josephson junctions 102. In some implementations, the JRM 105 may not include the Josephson junctions 101.

In order to construct a nondegenerate parametric three-wave mixing device (the Josephson parametric converter 130), which is capable of amplifying and/or mixing microwave signals at the quantum limit, the JRM 105 is incorporated into two microwave resonators at a radio frequency (RF) current anti-node of the multiple of their eigenmodes.

The JRM 105 is driven by external flux, which is $\Phi_{ext}$. The external flux can be applied using an on-chip flux line, using external magnetic coil, and/or using a very small magnetic material integrated on-chip or in the package.

One of the microwave resonators is Signal (S) resonator 115A and the other is an Idler (I) resonator 115B. The device is nondegenerate because the Signal microwave signal and the Idler microwave signal are input at separate ports. A coupling capacitor 110A connects the resonator 115A to a hybrid coupler while the coupling capacitor 110B connects the resonator 115B to a hybrid coupler. The hybrid couplers are off-chip/on-chip broadband 180 degree hybrids. The Josephson parametric converter 130 includes both the resonator 115A and resonator 115B, along with the JRM 105. The Signal (S) resonator 115A has a resonance frequency $f_1$ (also referred to as $f_S$) and the Idler (I) resonator 115B has a resonance frequency $f_2$ (also referred to as $f_I$). Embodiments include the case in which the Josephson parametric converter 130 is hybrid-less, and this means that the Josephson parametric converter 130 does not require hybrids for its operation, i.e., signal delivery to and from the device 130.

Figure 2:
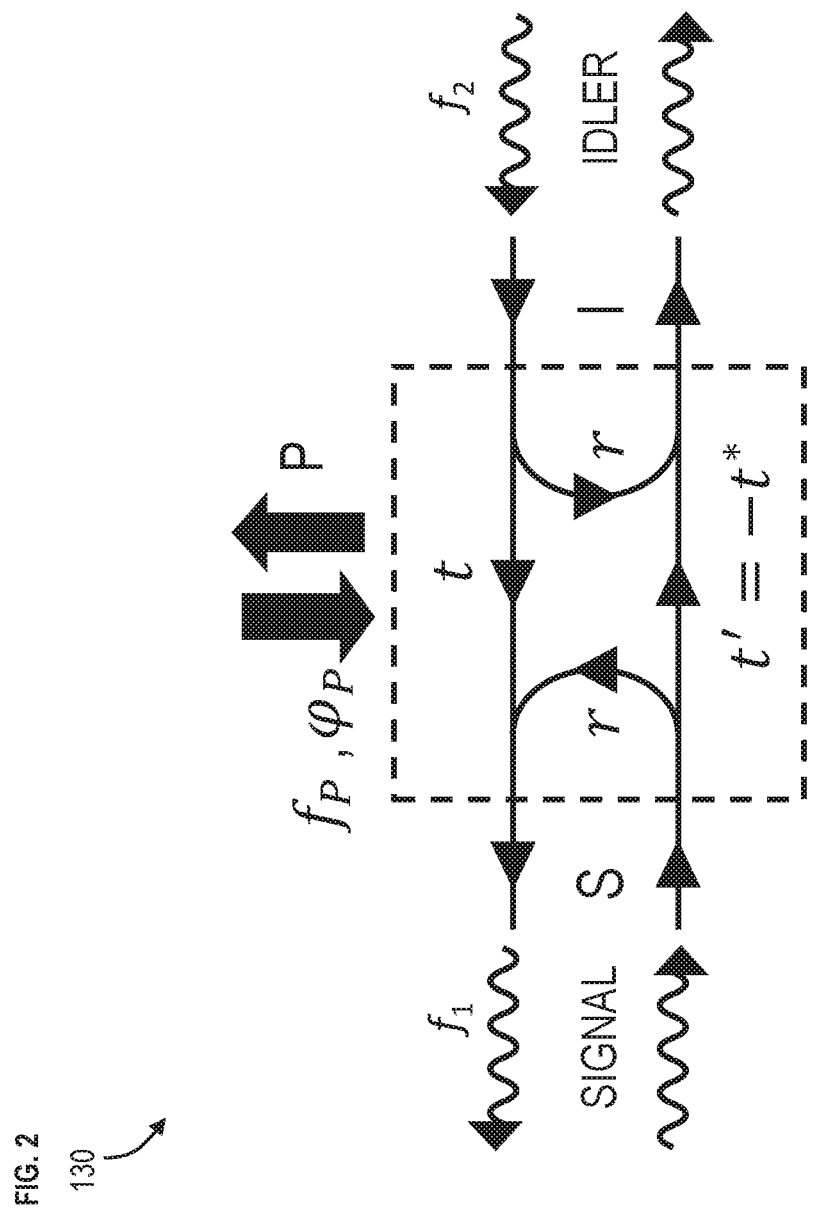
FIG. 2 depicts a signal flow graph of a superconducting nondegenerate three-wave mixing device according to embodiments of the invention.

The performances (namely power gain G, dynamical bandwidth $\gamma$, and maximum input power $P_{max}$) of the Josephson parametric converter 130 are strongly dependent on the critical current $I_0$ of the Josephson junctions 102 of the JRM 105, the specific realization of the electromagnetic environment (i.e., the microwave resonator 115A and microwave resonator 115B), the coupling between the JRM 105 and the resonators 115A and 115B, and the coupling between the resonators to the feedlines. Feedlines are the transmission lines that connect the resonators 115A and 115B to the two hybrid couplers. The transmission lines connecting the resonators 115A and 115B to the two hybrid couplers can be microwave coaxial lines or waveguides. Although not shown, other devices can be connected to opposite end of the hybrid couplers. Examples of the other device can include attenuators, circulators, isolators, low-pass microwave filters, bandpass microwave filters, infrared filters, and qubit-cavity systems. FIG. 2 depicts a signal flow graph of the superconducting nondegenerate three-wave mixing device 130 operated in frequency conversion mode according to embodiments. In frequency conversion mode, there is no photon gain. That is, the superconducting nondegenerate three-wave mixing device 130 is not operated as an amplifier. FIG. 2 depicts the signal flow graph for the nondegenerate three-wave mixing device 130.

The Josephson parametric converter 130 satisfies the following scattering matrix when operated in noiseless frequency conversion:

$$[S] = \begin{pmatrix} r & t \\ t' & r \end{pmatrix} = \begin{pmatrix} \cos\theta & ie^{i\varphi_P}\sin\theta \\ ie^{-i\varphi_P}\sin\theta & \cos\theta \end{pmatrix}.$$

As we will recognized herein the phase of the pump $\varphi_p$ will be utilized in accordance embodiments. Since the scattering matrix is unitary, the following relation holds $$|r|^2 + |t|^2 = 1,$$

where r is the reflection coefficient, t is the transmission parameter, and t'=t* (where t* is the conjugate of t). Unitary means that the device 130 preserves the energy and the coherence of the phase. The full conversion working point of the superconducting nondegenerate three-wave mixing device 130 is $$|r|^2 = 0, |t|^2 = 1.$$

At the full conversion working point, there is no reflection and there is full transmission with frequency conversion.

In FIG. 2, the superconducting nondegenerate three-wave mixing device 130 has 3 ports, which are the Signal port (S), the Idler port (I), and the pump port (P). The superconducting nondegenerate three-wave mixing device 130 has transmission t from Idler port to Signal port and transmission t' from Signal port to Idler port. From Idler to Signal port, the Idler microwave signal enters the Idler port at frequency $f_2$, is down converted, and exits the Signal port at frequency $f_1$. From Signal to Idler port, the Signal microwave signal enters the Signal port at frequency $f_1$, is up converted, and exits the Idler port at frequency $f_2$. The pump microwave signal provides the energy for frequency up conversion and frequency down conversion. The pump frequency is $f_P$, where $$f_P = f_I - f_S = f_2 - f_1.$$

Figure 3:
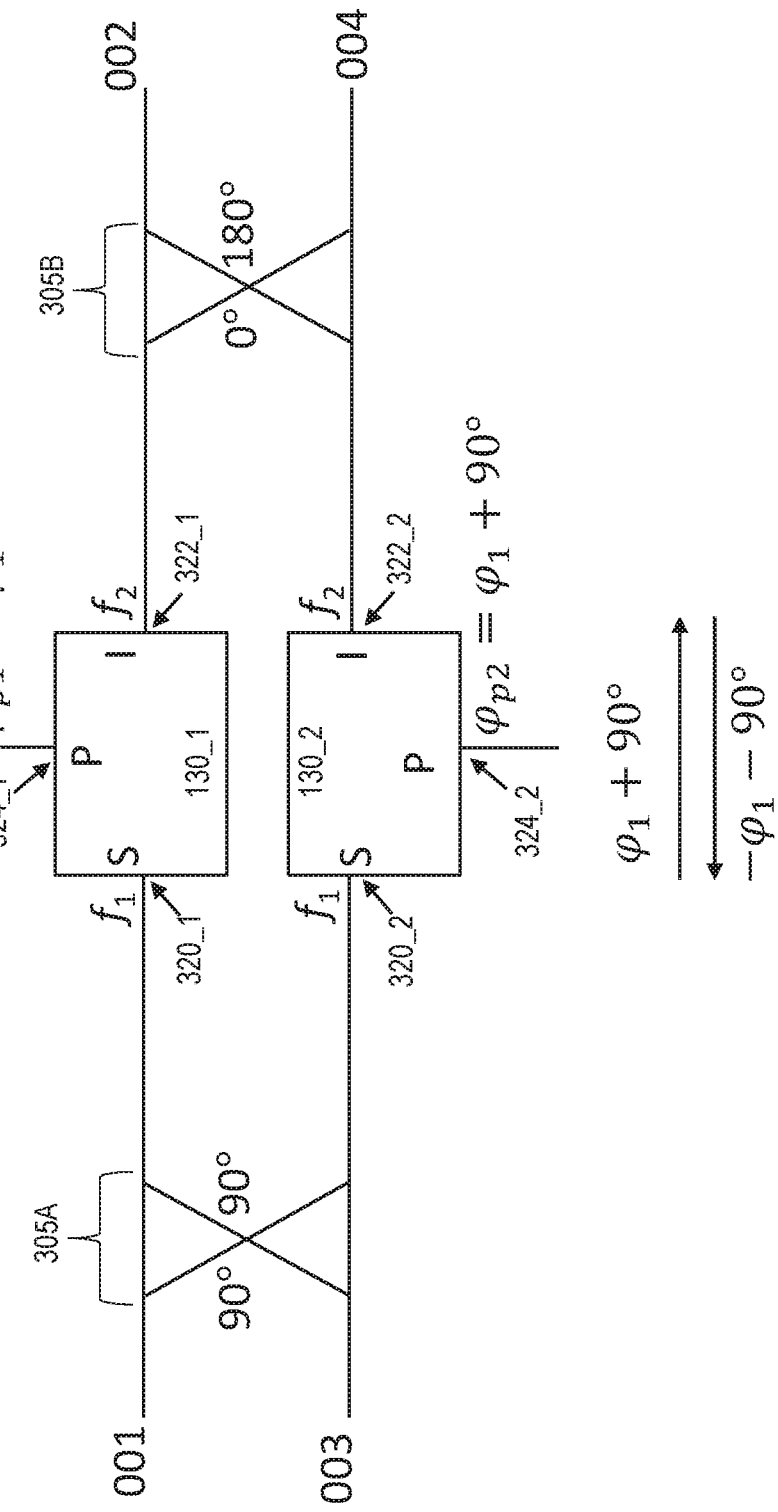
FIG. 3 depicts a schematic of a four-port circulator according to embodiments of the invention.
Figure 4:
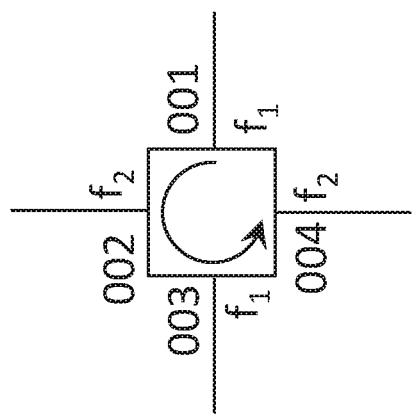
FIG. 4 depicts a symbol of a four-port circulator according to embodiments of the invention.

FIG. 3 depicts a schematic of an on-chip superconducting four-port circulator 300 according to embodiments. FIG. 4 depicts a four-port circulator symbol according to embodiments. The four-port circulator 300 includes two superconducting nondegenerate three-wave mixing devices 130 coupled together in parallel. The two superconducting nondegenerate three-wave mixing devices are designated as superconducting nondegenerate three-wave mixing devices 130_1 and 130_2, which operate the same as superconducting nondegenerate three-wave mixing devices 130 discussed herein. For explanation purposes, the top path runs through the superconducting nondegenerate three-wave mixing devices 130_1, and the bottom path runs through superconducting nondegenerate three-wave mixing devices 130_2. As understood by one skilled in the art, a four-port circulator has 4 ports: port 1, port 2, port 3, and port 4. Port 1 is designated as port 001, port 2 is designated as port 002, port 3 is designated as port 003, and port 4 is designated as 004. In a four-port circulator, a microwave signal applied to port 1 only comes out of port 2. A microwave signal applied to port 2 only comes out of port 3. A microwave signal applied to port 3 only comes out of port 4, and a microwave signal applied to port 4 only comes out of port 1.

The superconducting nondegenerate three-wave mixing devices 130_1 and 130_2 are (nominally) identical. The superconducting nondegenerate three-wave mixing devices 130_1 and 130_2 have respective ports 320_1 and 320_2 (which can be Signal ports connected to Signal resonators having the resonance frequency $f_1$). The superconducting nondegenerate three-wave mixing devices 130_1 and 130_2 have respective ports 322_1 and 322_2 (which can be Idler ports connected to Idler resonators having the resonance frequency $f_2$). The superconducting nondegenerate three-wave mixing devices 130_1 and 130_2 have ports 324_1 and 324_2 (which can be pump ports designed to receive the pump frequency $f_p$). The microwave pump signal at pump frequency $f_p$ can be applied to the signal resonator or the idler resonator through one of the $\Sigma$ ports of the hybrids or directly (without hybrids) through a separate physical port (as was demonstrated recently in several hybrid-less JPC circuits (in the state-of-the-art)). The microwave pump signal is applied at pump ports 324_1 and 324_2 with pump frequency $f_p$ and phase $\varphi_p$. For the superconducting nondegenerate three-wave mixing device 130_1, the microwave pump signal is applied to port 324_1 at pump frequency $f_p$ and phase $\varphi_{p1}$. For the superconducting nondegenerate three-wave mixing device 130_2, the microwave pump signal is applied to port 324_2 at pump frequency $f_p$ and phase $\varphi_{p2}$. The pump frequency $f_p$ is $f_p = |f_2 - f_1|$ for the microwave pump signals input to both three-wave mixing devices 130_1 and 130_2 is the same, where $f_2 > f_1$. The phase $\varphi_{p1} = \varphi_1$ for the microwave pump signal applied at port 324_1. The phase $\varphi_{p2} = \varphi_1 + 90°$ for the microwave pump signal applied at port 324_2. As can be recognized, the microwave pump signal input into pump port 324_1 for the superconducting nondegenerate three-wave mixing device 130_1 is out of phase with the microwave pump signal input into pump port 324_2 for the superconducting nondegenerate three-wave mixing device 130_2 by 90°. This 90° phase difference is utilized in conjunction with hybrid couplers 305A and 305B to form and operate the on-chip superconducting four-port circulator 300 as a circulator according to embodiments. Additionally, the superconducting nondegenerate three-wave mixing devices 130_1 and 130_2 are both operated at their full conversion working point where reflection r is 0 and transmission |t| is 1 and operated in frequency conversion (i.e., not as an amplifier with photon gain).

In FIG. 3, a 90° hybrid coupler 305A is connected to ports 320_1 and 320_2. The 90° hybrid coupler 305A has two input ports designated as port 001 (i.e., port 1) and port 003 (i.e., port 3). A 180° hybrid coupler 305B is connected to ports 322_1 and 322_2. The 180° hybrid coupler 305B has two input ports designated as port 002 (i.e., port 2) and port 004 (i.e., port 4).

A 90° hybrid is a four-port microwave device which is reciprocal, matched, and ideally lossless. A 90° hybrid coupler is a specialized coupler that has two output ports that are 90 degrees out of phase with each other, splitting power equally between its two output ports. The 90° hybrid splits an input signal into two equal amplitude outputs, where one output is in-phase with the input signal, while the other output is 90° out-of-phase with the input signal.

A 180° hybrid is a four-port microwave device which is reciprocal, matched, and ideally lossless. The 180° hybrid splits an input signal into two equal amplitude outputs. When fed from its sum port (Σ) (i.e., 0° port), the 180° hybrid provides two equal-amplitude in-phase output signals (which are also in-phase with the input signal), and when fed from its difference port (Δ) (i.e., 180° port), it provides two equal-amplitude 180° out-of-phase output signals (one output in-phase with the input signal, while the other is 180° out-of-phase with the input signal). It should be noted that the 90° hybrids and 180° hybrids do not need to be implemented using transmission-line circuits. The 90° hybrids and 180° hybrids can also be implemented using lumped elements (lumped capacitors and inductors). Examples of lumped capacitors include plate capacitors, gap capacitors, interdigitated capacitors, etc. Examples of lumped inductors include, spirals and narrow, meandering superconducting wires.

The operation mode of the devices 130_1 and 130_2 is unitary frequency conversion mode (without photon gain) in which the applied pump frequency $f_P$ satisfies the relation $f_P = |f_1 - f_S|$.

Now providing more details of the operation of the four-port circulator device 300, the device 300 realizes an on-chip nondegenerate four-port circulator. The device 300 transmits microwave signals entering the device ports in a certain (predefined) direction, and the signals undergo unitary frequency conversion (up conversion/down conversion). For example, microwave signals entering port 1 (e.g., port 001) at frequency $f_1$ are up converted to frequency $f_2$ and transmitted without loss or with low loss to port 2 (e.g., port 002). Microwave signals entering port 2 (e.g., port 002) at frequency $f_2$ are down converted to frequency $f_1$ and transmitted without loss or with low loss to port 3 (e.g., port 003). Microwave signals entering port 3 (e.g., port 003) at frequency $f_1$ are up converted to frequency $f_2$ and transmitted without loss or with low loss to port 4 (e.g., port 004). Microwave signals entering port 4 (e.g., port 004) at frequency $f_2$ are down converted to frequency $f_1$ and transmitted without loss or with low loss to port 1 (e.g., port 001). The device 300 provides isolation in the opposite circulation direction, i.e., port 1 is isolated from signals input on port 2, port 2 is isolated from signals input on port 3, port 3 is isolated from signals input on port 4, and port 4 is isolated from signals input on port 1. The (predefined) circulation direction is shown by the circular arrow, for example, in FIG. 4, while the opposite circulation direction would be in the opposite direction of the circular arrow.

The device 300 consists of two stages of nondegenerate three-wave mixing Josephson devices 130_1 and 130_2, which can be Josephson parametric converters. The two stages are connected in parallel, using two hybrids, i.e., 90° hybrid 305A and 180° hybrid. The two inputs of the 90° hybrid 305A define ports 1 and 3 of the circulator 300, and the two outputs of the 90° hybrid 305A are connected to the signal ports 320_1 and 320_2 of the (JPC) stages. Similarly, the inputs of the 180° hybrid define ports 2 and 4 of the circulator 300, and the two outputs of the 180° hybrid are connected to the Idler ports 322_1 and 322_2 of the (JPC) stages.

By operating the nondegenerate three-wave mixing devices 130_1 and 130_2 in noiseless frequency conversion mode (no photon gain) and setting their working point to full conversion, in which reflections off the ports 320 and 322 are minimized and the transmissions (including up conversion/down conversion) to the other port (ports 320 and 322) are maximized. The phase difference (phase $\varphi_{p1} = \varphi_1$ versus the phase $\varphi_{p2} = \varphi_1 + 90°$) between the pump drives (via pump ports 324_1 and 324_2) feeding the two nondegenerate three-wave mixing Josephson devices 130_1 and 130_2 introduces a non-reciprocal phase shift to the signals propagating across the nondegenerate three-wave mixing Josephson devices 130_1 and 130_2. It is noted that propagating across is illustrated as left-to-right or right-to-left for explanation purposes, but one skilled it the under understands the orientation of the figures can be changed. During operation, the nondegenerate three-wave mixing Josephson device 130_1 is configured to add a $\varphi_1$ phase shift to any signal received at port 320_1 (e.g., Signal port) and output at port 322_1 (Idler port). In the opposite direction, the nondegenerate three-wave mixing Josephson devices 130_1 is configured to add a $-\varphi_1$ phase shift to any signal received at port 322_1 (Idler port) and output at port 320_1 (e.g., Signal port). The addition of $\varphi_1$ or $-\varphi_1$ is related to the direction (which is left or right in the figures for explanation only) that the signal is input into the nondegenerate three-wave mixing Josephson devices 130_1. Because the pump signal (pump drive) received at port 324_1 has the pump phase $\varphi_{p1} = \varphi_1$, the addition of $\varphi_1$ to the signal input from port 320_1 output to port 322_1 occurs or the addition of $-\varphi_1$ to the signal input from port 322_1 output to port 320_1 occurs.

A similar phase change happens in nondegenerate three-wave mixing Josephson device 130_1 according to its pump drive with phase $\varphi_1 + 90°$. During operation, the nondegenerate three-wave mixing Josephson device 130_2 is configured to add a $\varphi_1 + 90°$ phase shift to any signal received at port 320_2 (e.g., Signal port) and output at port 322_2 (Idler port). In the opposite direction, the nondegenerate three-wave mixing Josephson devices 130_2 is configured to add a $-\varphi_1 - 90°$ phase shift to any signal received at port 322_2 (Idler port) and output at port 320_2 (e.g., Signal port). The addition of $\varphi_1+90°$ or $-\varphi_1-90°$ is related to the direction (which is left or right in the figures for explanation only) that the signal is input into the nondegenerate three-wave mixing Josephson devices 130_2. Because the pump signal (pump drive) received at port 324_2 has the pump phase $\varphi_{p1}=\varphi_1+90°$, the addition of $\varphi_1+90°$ to the signal input from port 320_2 output to port 322_2 occurs or the addition of $-\varphi_1-90°$ to the signal input from port 322_2 output to port 320_2 occurs.

The phase difference between the two pumps (i.e., the two microwave pump signals at frequency $f_P$) feeding the two stages is 90 degrees. A microwave pump is a device that generates microwave signals (also called microwave tones). A microwave pump is connected to pump port 324_1 and a separate microwave pump is connected to pump port 324_2. By reversing this phase difference between the two microwave signals, the circulation direction of the circulation can be reversed in-situ in one implementation.

Figure 5:
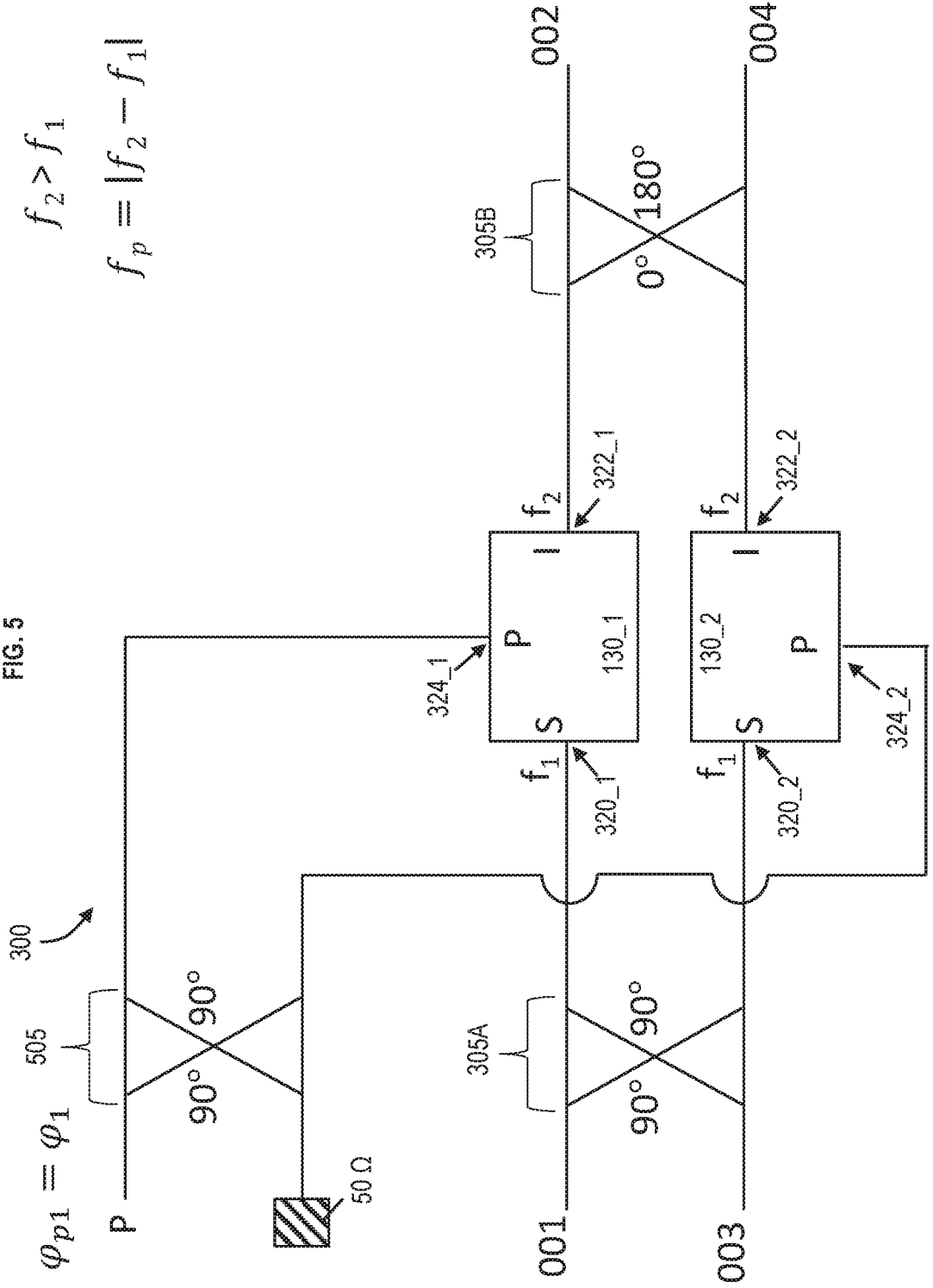
FIG. 5 depicts a schematic of a four-port circulator according to embodiments of the invention.

In FIG. 3, each microwave pump drive is fed to its respective pump port 324_1 and 324_2 via transmission lines. Instead of having two pump drives as shown in FIG. 3, one single pump drive can be fed to the whole device through a 90° hybrid coupler 505 as depicted in FIG. 5 according to embodiments. The 90° hybrid coupler 505 imposes the required phase difference (i.e., 90° phase difference) between the pump drives injected into the two three-wave mixing stages. This assumes that the two nondegenerate three-wave mixing devices 130_1 and 130_2 are nominally identical. FIG. 5 shows that one port of the 90° hybrid coupler 505 receives the microwave pump signal while the other input port of the hybrid is connected to a 50Ω termination.

The device operation of device 300 is based on wave interference between two paths, in which one path passes through the first stage (e.g., top path), and the other path that passes through the second stage (e.g., bottom path). The wave interference is enabled via the hybrids 305_A and 305_B, which act as beam-splitters. If the two split waves of an input signal of one port, passing through the two paths, add up constructively (in phase, i.e., peaks match) at a particular port, after being up converted or down converted, the signal exits that port with almost unity transmission. Conversely, if the output waves destructively interfere (have a phase difference of 180°) at a certain port, then that port is isolated from the input port through which the signal entered.

For explanation purposes and not limitation, FIGS. 6-12 depict examples of operating the four-port circulator 300 using wave interference according to embodiments.

Figure 6:
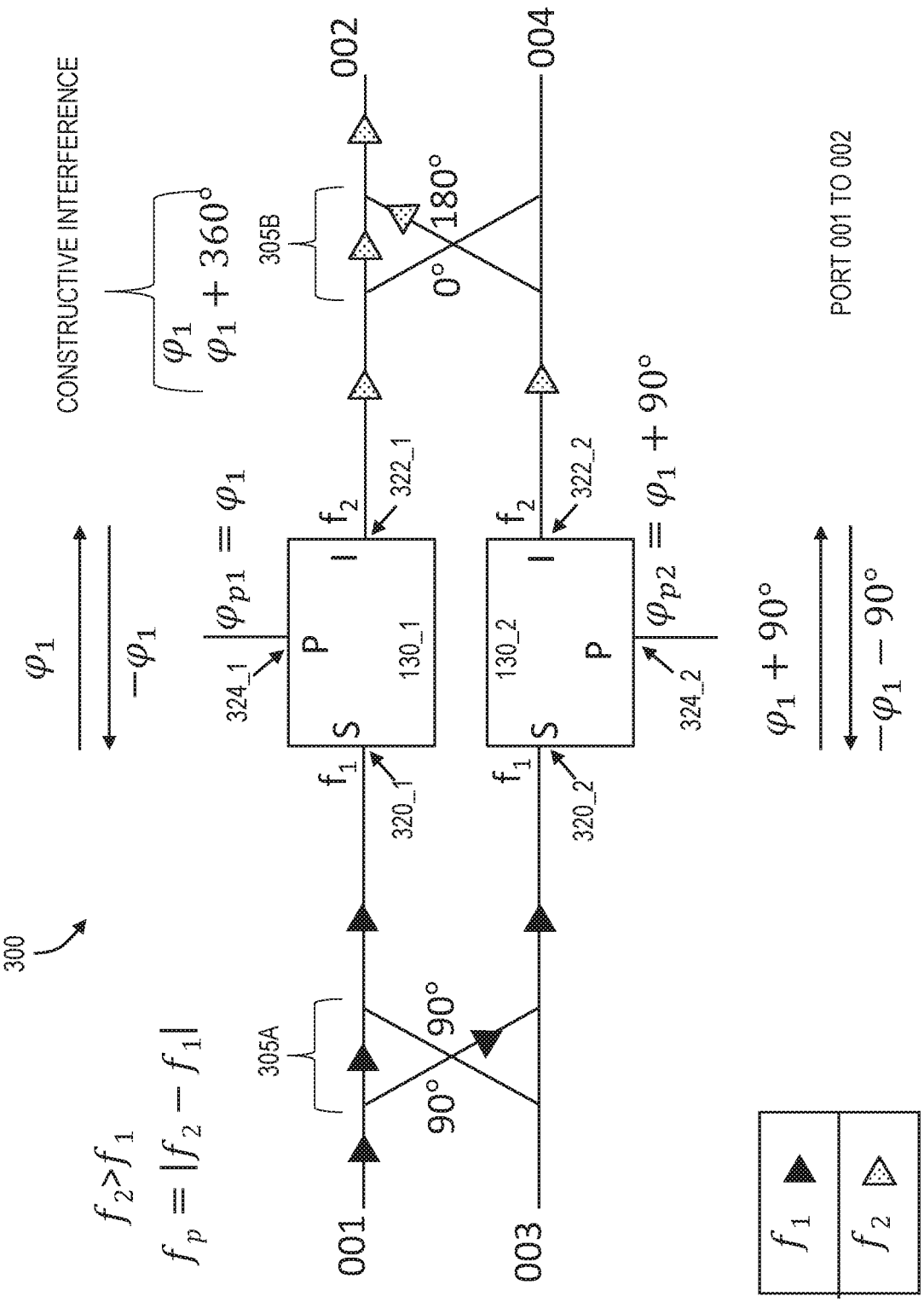
FIG. 6 depicts operation of a four-port circulator according to embodiments of the invention.

FIG. 6 depicts operating the four-port circulator 300 when a microwave signal at frequency $f_1$ is input to port 001 (e.g., port 1) of the 90° hybrid 305A to be output at port 002 (e.g., port 2) at frequency $f_2$ according to embodiments. The microwave signal at frequency $f_1$ is received at port 001 of the 90° hybrid coupler 305A. The hybrid coupler 305A is configured to split the power of the microwave signal received at port 001. The hybrid coupler 305A is configured to transmit the first part (i.e., ½) of the microwave signal (without a phase shift) to port 320_1 of the superconducting nondegenerate three-wave mixing device 130_1. Also, the 90° hybrid coupler 305A is configured to add a 90° phase shift to the second part (i.e., ½) of the microwave signal and transmit the second part of the microwave signal to port 320_2 of the superconducting nondegenerate three-wave mixing devices 130_2.

The first part of the microwave signal (with no phase change) received at port 320_1 and the second part of microwave signal (with 90° phase increase) received at port 320_2 are both up converted from frequency $f_1$ to frequency $f_2$ by their respective mixing devices 130_1 and 130_2. Additionally, the nondegenerate three-wave mixing Josephson device 130_1 is configured to add a $\varphi_1$ phase shift to the first part of the microwave signal having been received at port 320_1. Similarly, the nondegenerate three-wave mixing Josephson device 130_2 is configured to add a $\varphi_1+90°$ phase shift to the 90° phase of the second part of microwave signal having been received at port 320_2, resulting in $\varphi_1+180°$.

The up converted first part of the microwave signal at frequency $f_2$ with phase $\varphi_1$ is transmitted from mixing device 130_1 to the hybrid coupler 305B, and the up converted second part of microwave signal at frequency $f_2$ with phase $\varphi_1+180°$ is transmitted from mixing device 130_2 to the 180° hybrid coupler 305B. The 180° hybrid coupler 305B is configured to transmit the up converted first part of microwave signal at frequency $f_2$ with phase $\varphi_1$ to port 002, which means the 180° hybrid coupler 305B adds no phase. After receiving the up converted second part of microwave signal at frequency $f_2$ with phase $\varphi_1+180°$, the 180° hybrid coupler 305B is configured to add 180° phase to the phase $\varphi_1+180°$, resulting in phase $\varphi_1+360°$, and transmit the up converted second part of microwave signal at frequency $f_2$ with phase $\varphi_1+360°$ to port 002. Constructive interference occurs at port 002 of the microwave signals transmitted from mixing devices 130_1 and 130_2. At output port 002 of the 180° hybrid coupler 305B, the phase of the first part of microwave signal from the top path has phase $\varphi_1$ and the phase from the second part of microwave signal from the bottom path has phase $\varphi_1+360°$. Therefore, the two microwave signals (having been received from mixing devices 130_1 and 130_2) add constructively via hybrid coupler 305B to be output at port 002, such that the microwave signal at frequency $f_1$ is input to port 001 of the 90° hybrid 305A and output at port 002 (e.g., port 2) of 180° hybrid 305B at frequency $f_1$. However, with respect to port 004 of the 180° hybrid 305B, the first part and second part of the microwave signals (having been received from mixing devices 130_1 and 130_2) add destructively via hybrid coupler 305B and no microwave signal is output from port 004.

Figure 7:
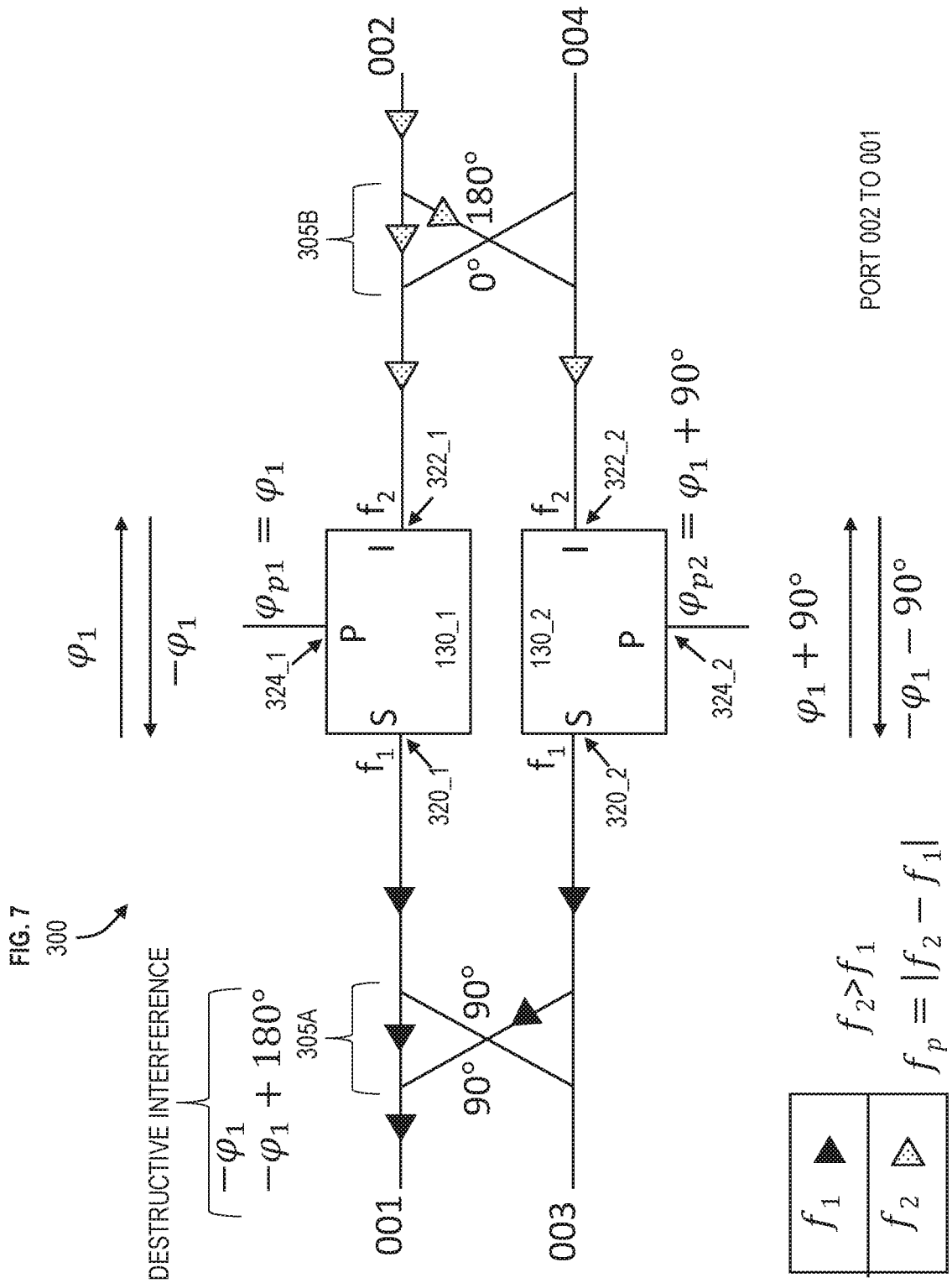
FIG. 7 depicts operation of a four-port circulator according to embodiments of the invention.

FIG. 7 depicts operating the four-port circulator 300 when a microwave signal at frequency $f_2$ is input to port 002 (e.g., port 2) of the 180° hybrid 305B to be output at port 001 (e.g., port 1) at frequency $f_1$ according to embodiments. However, destructive interference occurs in this example. The microwave signal at frequency $f_2$ is received at port 002 of the 180° hybrid coupler 305B. The hybrid coupler 305B is configured to split the power of the microwave signal received at port 002. The hybrid coupler 305B is configured to transmit the first part (i.e., ½) of the microwave signal (without a phase shift) to port 322_1 of the superconducting nondegenerate three-wave mixing device 130_1. Also, the 180° hybrid coupler 305A is configured to add a 180° phase shift to the second part (i.e., ½) of the microwave signal and transmit the second part of the microwave signal to port 322_2 of the superconducting nondegenerate three-wave mixing devices 130_2.

The first part of the microwave signal (with no phase change) received at port 322_1 and the second part of microwave signal with 180° phase received at port 322_2 are both down converted from frequency $f_2$ to frequency $f_1$ by their respective mixing devices 130_1 and 130_2. Additionally, the nondegenerate three-wave mixing Josephson device 130_1 is configured to add a $-\varphi_1$ phase shift to the first part of the microwave signal having been received at port 322_1. Similarly, the nondegenerate three-wave mixing Josephson device 130_2 is configured to add a $-\varphi_1-90°$ phase shift to the 180° phase of the second part of microwave signal having been received at port 322_2, resulting in $-\varphi_1+90°$.

The down converted first part of the microwave signal at frequency $f_1$ with phase $\varphi_1$ is transmitted from mixing device 130_1 to the 90° hybrid coupler 305A, and the down converted second part of microwave signal at frequency $f_1$ with phase $-\varphi_1+90°$ is transmitted from mixing device 130_2 to the 90° hybrid coupler 305A. The 90° hybrid coupler 305A is configured to transmit the down converted first part of microwave signal at frequency $f_1$ with phase $-\varphi_1$ to port 001, which means the 90° hybrid coupler 305A adds no phase. After receiving the down converted second part of microwave signal at frequency $f_1$ with phase $-\varphi_1+90°$, the 90° hybrid coupler 305A is configured to add 90° phase to the phase $-\varphi_1+90°$, resulting in phase $-\varphi_1+180°$, and transmit the up converted second part of microwave signal at frequency $f_2$ with phase $-\varphi_1+180°$ to port 001. Destructive interference occurs at port 001 of the microwave signals transmitted from mixing devices 130_1 and 130_2. At output port 001 of the 90° hybrid coupler 305A, the phase of the first part of microwave signal from the top path has phase $-\varphi_1$ and the phase from the second part of microwave signal from the bottom path has phase $-\varphi_1+180°$. Therefore, the two microwave signals (having been received from mixing devices 130_1 and 130_2) add destructively via hybrid coupler 305A and there is no microwave signal output at port 001. However, with respect to port 003 of the 90° hybrid 305A, the first part and second part of the microwave signals (having been received from mixing devices 130_1 and 130_2) add constructively via hybrid coupler 305A and the microwave signal is output from port 003, as depicted in FIG. 8.

Figure 8:
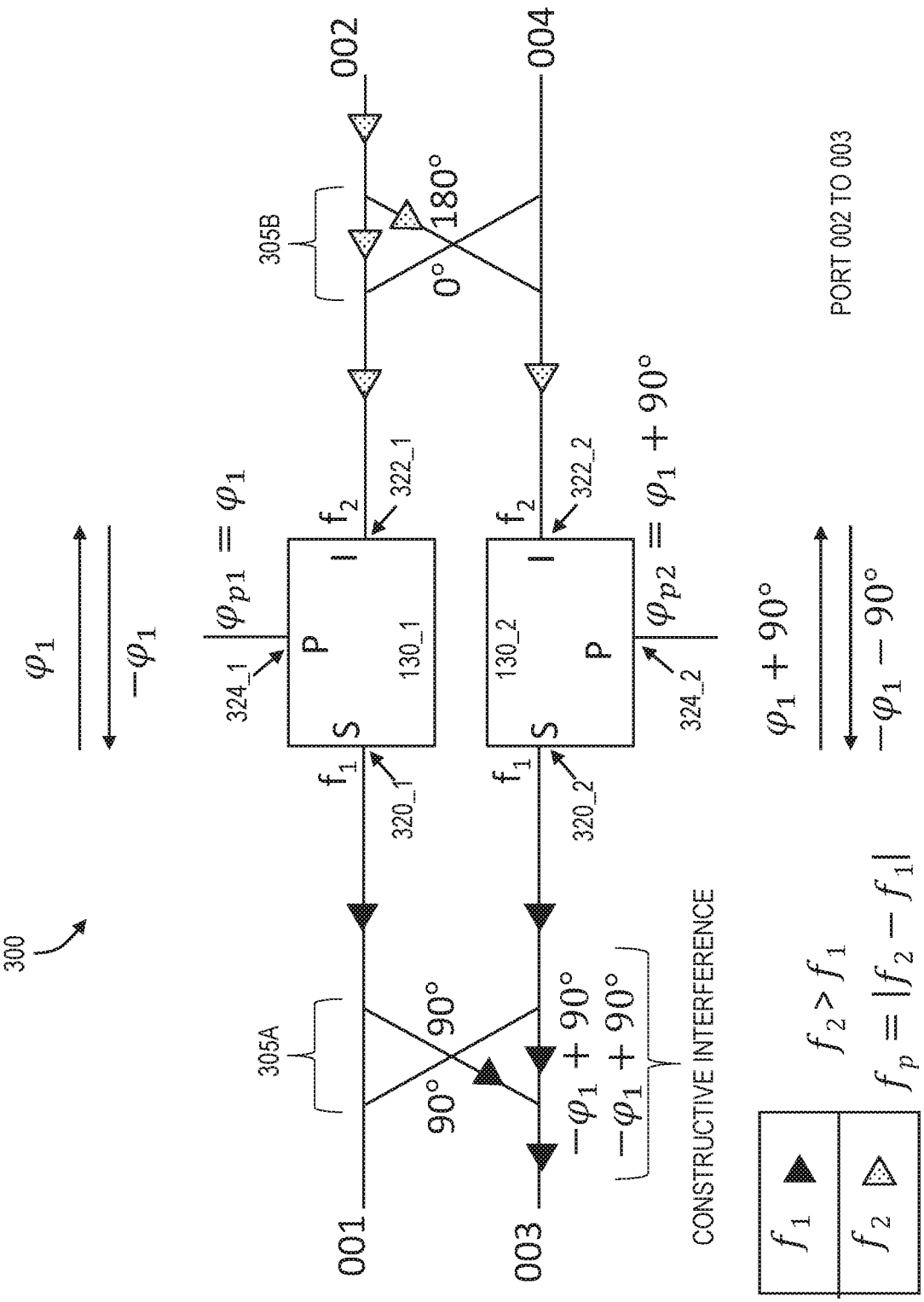
FIG. 8 depicts operation of a four-port circulator according to embodiments of the invention.

FIG. 8 depicts operating the four-port circulator 300 when a microwave signal at frequency $f_2$ is input to port 002 (e.g., port 2) of the 180° hybrid 305B to be output at port 003 (e.g., port 3) at frequency $f_1$ according to embodiments. The microwave signal at frequency $f_2$ is received at port 002 of the 180° hybrid coupler 305B. The hybrid coupler 305B is configured to split the power of the microwave signal received at port 002. The hybrid coupler 305B is configured to transmit the first part (i.e., ½) of the microwave signal (without a phase shift) to port 322_1 of the superconducting nondegenerate three-wave mixing device 130_1. Also, the 180° hybrid coupler 305A is configured to add a 180° phase shift to the second part (i.e., ½) of the microwave signal and transmit the second part of the microwave signal to port 322_2 of the superconducting nondegenerate three-wave mixing devices 130_2.

The first part of the microwave signal (with no phase change) received at port 322_1 and the second part of microwave signal with 180° phase received at port 322_2 are both down converted from frequency $f_2$ to frequency $f_1$ by their respective mixing devices 130_1 and 130_2. Additionally, the nondegenerate three-wave mixing Josephson device 130_1 is configured to add a $-\varphi_1$ phase shift to the first part of the microwave signal having been received at port 322_1. Similarly, the nondegenerate three-wave mixing Josephson device 130_2 is configured to add a $-\varphi_1-90°$ phase shift to the 180° phase of the second part of microwave signal having been received at port 322_2, resulting in phase $-\varphi_1+90°$.

The down converted first part of the microwave signal at frequency $f_1$ with phase $\varphi_1$ is transmitted from mixing device 130_1 to the 90° hybrid coupler 305A, and the down converted second part of microwave signal at frequency $f_1$ with phase $-\varphi_1+90°$ is transmitted from mixing device 130_2 to the 90° hybrid coupler 305A. After receiving the down converted first part of microwave signal at frequency $f_1$ with phase $-\varphi_1$, the 90° hybrid coupler 305A is configured to add 90° phase to the phase $-\varphi_1$, resulting in phase $-\varphi_1+90°$, and transmit the down converted first part of microwave signal at frequency $f_1$ with phase $-\varphi_1+90°$ to port 003. The 90° hybrid coupler 305A is configured to transmit the down converted second part of microwave signal at frequency $f_1$ with phase $-\varphi_1+90°$ to port 003, which means the 90° hybrid coupler 305A adds no phase. Constructive interference occurs at port 003 for the microwave signals transmitted from mixing devices 130_1 and 130_2. At output port 003 of the 90° hybrid coupler 305A, the phase of the first part of microwave signal from the top path has phase $-\varphi_1+90°$ and the phase of the second part of microwave signal from the bottom path has phase $-\varphi_1+90°$. Therefore, the two microwave signals (having been received from mixing devices 130_1 and 130_2) add constructively via hybrid coupler 305A and the combined microwave signal is output at port 003. The destructive interference was depicted in FIG. 7 at port 001.

Figure 9:
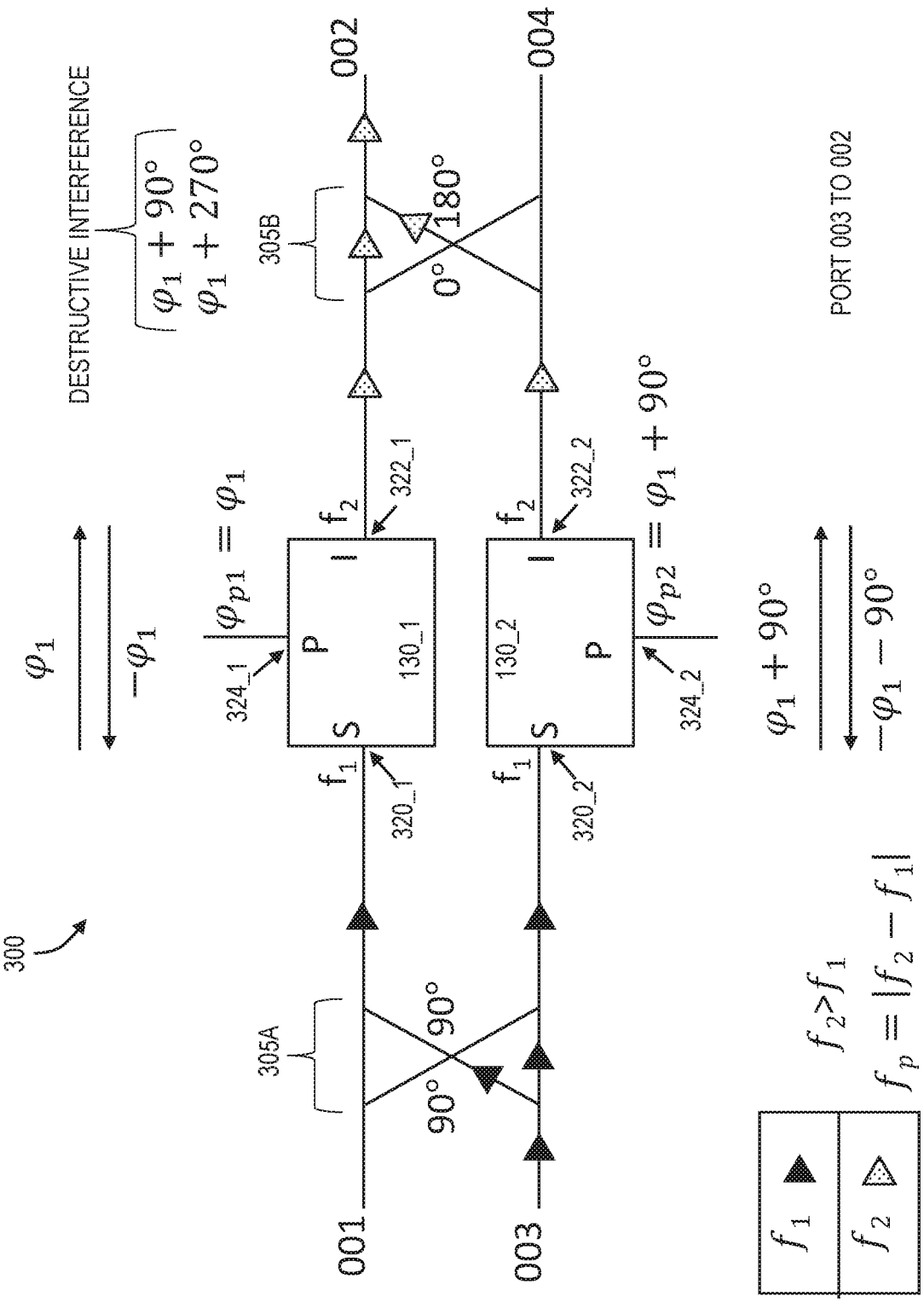
FIG. 9 depicts operation of a four-port circulator according to embodiments of the invention.

FIG. 9 depicts operating the four-port circulator 300 when a microwave signal at frequency $f_1$ is input to port 003 (e.g., port 3) of the 90° hybrid 305A to be output at port 002 (e.g., port 2) at frequency $f_2$ according to embodiments. Destructive interference occurs in this scenario. The microwave signal at frequency $f_1$ is received at port 003 of the 90° hybrid coupler 305A. The hybrid coupler 305A is configured to split the power of the microwave signal received at port 003. Also, the 90° hybrid coupler 305A is configured to add a 90° phase shift to the first part (i.e., ½) of the microwave signal and transmit the first part of the microwave signal to port 320_1 of the superconducting nondegenerate three-wave mixing devices 130_1. The hybrid coupler 305A is configured to transmit the second part (i.e., ½) of the microwave signal (without a phase shift) to port 320_2 of the superconducting nondegenerate three-wave mixing device 130_2.

The first part of the microwave signal (with 90° phase increase) received at port 320_1 and the second part of microwave signal (with no phase change) received at port 320_2 are both up converted from frequency $f_1$ to frequency $f_1$ by their respective mixing devices 130_1 and 130_2. Additionally, the nondegenerate three-wave mixing Josephson device 130_1 is configured to add a $\varphi_1$ phase shift to the first part of the microwave signal having been received at port 320_1, resulting in $\varphi_1+90°$. Similarly, the nondegenerate three-wave mixing Josephson device 130_2 is configured to add a $\varphi_1+90°$ phase shift to the second part of microwave signal having been received at port 320_2, resulting in phase $\varphi_1+90°$.

The up converted first part of the microwave signal at frequency $f_2$ with phase $\varphi_1+90°$ is transmitted from mixing device 130_1 to the hybrid coupler 305B, and the up converted second part of microwave signal at frequency $f_2$ with phase $\varphi_1+90°$ is transmitted from mixing device 130_2 to the 180° hybrid coupler 305B. The 180° hybrid coupler 305B is configured to transmit the up converted first part of microwave signal at frequency $f_2$ with phase $\varphi_1+90°$ to port 002, which means the 180° hybrid coupler 305B adds no phase. After receiving the up converted second part of microwave signal at frequency $f_2$ with phase $\varphi_1+90°$, the 180° hybrid coupler 305B is configured to add 180° phase to the phase $\varphi_1+180°$, resulting in phase $\varphi_1+270°$, and transmit the up converted second part of microwave signal at frequency $f_2$ with phase $\varphi_1+270°$ to port 002. Destructive interference occurs at port 002 of the microwave signals transmitted from mixing devices 130_1 and 130_2. At output port 002 of the 180° hybrid coupler 305B, the phase of the first part of microwave signal from the top path has phase $\varphi_1+90°$ and the phase from the second part of microwave signal from the bottom path has phase $\varphi_1+270°$. Therefore, the two microwave signals (having been received from mixing devices 130_1 and 130_2) add destructively via hybrid coupler 305B, and no microwave signal is output at port 002. However, with respect to port 004 of the 180° hybrid 305B, the first part and second part of the microwave signals (having been received from mixing devices 130_1 and 130_2) add constructively via hybrid coupler 305B and a combined microwave signal is output from port 004, as depicted in FIG. 10.

Figure 10:
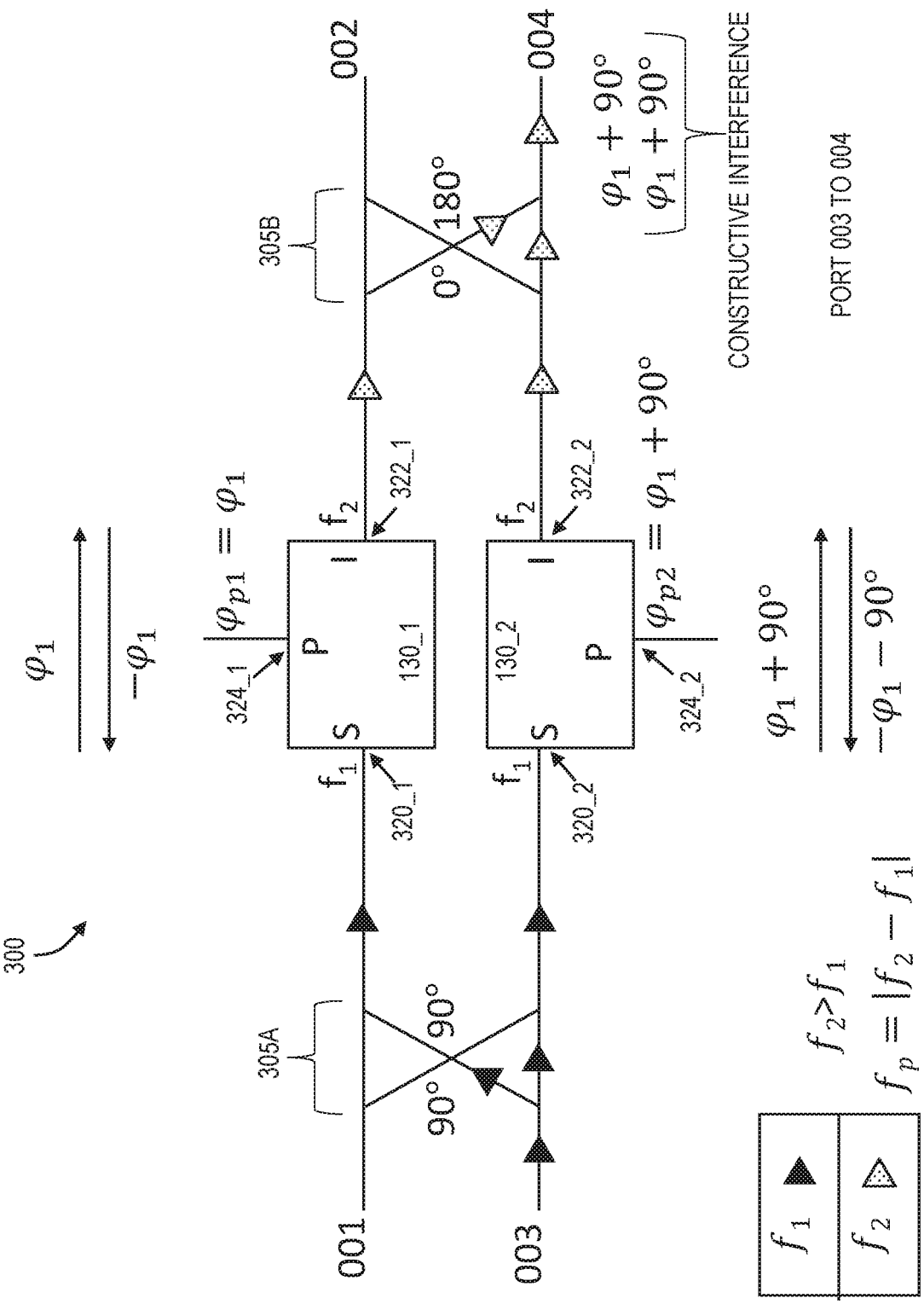
FIG. 10 depicts operation of a four-port circulator according to embodiments of the invention.

FIG. 10 depicts operating the four-port circulator 300 when a microwave signal at frequency $f_1$ is input to port 003 (e.g., port 3) of the 90° hybrid 305A to be output at port 004 (e.g., port 4) at frequency $f_2$ according to embodiments. The microwave signal at frequency $f_1$ is received at port 003 of the 90° hybrid coupler 305A. The hybrid coupler 305A is configured to split the power of the microwave signal received at port 003. Also, the 90° hybrid coupler 305A is configured to add a 90° phase shift to the first part (i.e., ½) of the microwave signal and transmit the first part of the microwave signal to port 320_1 of the superconducting nondegenerate three-wave mixing devices 130_1. The hybrid coupler 305A is configured to transmit the second part (i.e., ½) of the microwave signal (without a phase shift) to port 320_2 of the superconducting nondegenerate three-wave mixing device 130_2.

The first part of the microwave signal (with 90° phase increase) received at port 320_1 and the second part of microwave signal (with no phase change) received at port 320_2 are both up converted from frequency $f_1$ to frequency $f_1$ by their respective mixing devices 130_1 and 130_2. Additionally, the nondegenerate three-wave mixing Josephson device 130_1 is configured to add a $\varphi_1$ phase shift to the first part of the microwave signal having been received at port 320_1, resulting in phase $\varphi_1+90°$. Similarly, the nondegenerate three-wave mixing Josephson device 130_2 is configured to add a $\varphi_1+90°$ phase shift to the second part of microwave signal having been received at port 320_2, resulting in phase $\varphi_1+90°$.

The up converted first part of the microwave signal at frequency $f_2$ with phase $\varphi_1+90°$ is transmitted from mixing device 130_1 to the hybrid coupler 305B, and the up converted second part of microwave signal at frequency $f_2$ with phase $\varphi_1+90°$ is transmitted from mixing device 130_2 to the 180° hybrid coupler 305B. After receiving up converted first part of the microwave signal at frequency $f_2$ with phase $\varphi_1+90°$, the 180° hybrid coupler 305B is configured add 0° phase (no phase shift) to phase $\varphi_1+90°$ and to transmit the up converted first part of microwave signal at frequency $f_2$ with phase $\varphi_1+90°$ to port 004, which means the 180° hybrid coupler 305B adds no phase. After receiving the up converted second part of microwave signal at frequency $f_2$ with phase $\varphi_1+90°$, the 180° hybrid coupler 305B is configured to transmit the up converted second part of microwave signal at frequency $f_2$ with phase $\varphi_1+90°$ to port 004. Constructive interference occurs at port 004 for the microwave signals transmitted from mixing devices 130_1 and 130_2. At output port 004 of the 180° hybrid coupler 305B, the phase of the first part of microwave signal from the top path has phase $\varphi_1+90°$ and the phase of the second part of microwave signal from the bottom path has phase $\varphi_1+90°$. Therefore, the two microwave signals (having been received from mixing devices 130_1 and 130_2) add constructively via hybrid coupler 305B, and a combined microwave signal is output at port 004. However, with respect to port 002 of the 180° hybrid 305B, the first part and second part of the microwave signals (having been received from mixing devices 130_1 and 130_2) add destructively via hybrid coupler 305B and no microwave signal is output from port 002, as depicted in FIG. 9.

FIG. 11 depicts operating the four-port circulator 300 when a microwave signal at frequency $f_2$ is input to port 004 (e.g., port 4) of the 180° hybrid 305B to be output at port 003 (e.g., port 3) at frequency $f_1$ according to embodiments. This scenario depicts destructive interference. The microwave signal at frequency $f_2$ is received at port 004 of the 180° hybrid coupler 305B. The hybrid coupler 305B is configured to split the power of the microwave signal received at port 004. The 180° hybrid coupler 305A is configured to add a 0° phase shift to the first part (i.e., ½) of the microwave signal and transmit the first part of the microwave signal to port 322_1 of the superconducting nondegenerate three-wave mixing devices 130_1. The hybrid coupler 305B is configured to transmit the second part (i.e., ½) of the microwave signal (without a phase shift) to port 322_2 of the superconducting nondegenerate three-wave mixing device 130_2.

The first part of the microwave signal with 0° phase received at port 322_1 and the second part of microwave signal with no phase (i.e., 0°) change received at port 322_2 are both down converted from frequency $f_2$ to frequency $f_1$ by their respective mixing devices 130_1 and 130_2. Additionally, the nondegenerate three-wave mixing Josephson device 130_1 is configured to add a $-\varphi_1$ phase shift to 0° phase of the first part of the microwave signal having been received at port 322_1, resulting in phase $-\varphi_1$. Similarly, the nondegenerate three-wave mixing Josephson device 130_2 is configured to add a $-\varphi_1-90°$ phase shift to the 0° phase of the second part of microwave signal having been received at port 322_2, resulting in phase $-\varphi_1-90°$.

The down converted first part of the microwave signal at frequency $f_1$ with phase $-\varphi_1$ is transmitted from mixing device 130_1 to the 90° hybrid coupler 305A, and the down converted second part of microwave signal at frequency $f_1$ with phase $-\varphi_1-90°$ is transmitted from mixing device 130_2 to the 90° hybrid coupler 305A. After receiving the down converted first part of microwave signal at frequency $f_1$ with phase $-\varphi_1$, the 90° hybrid coupler 305A is configured to add 90° phase to the phase $-\varphi_1$, resulting in phase $-\varphi_1+90°$, and transmit the up converted first part of microwave signal at frequency $f_2$ with phase $-\varphi_1+90°$ to port 003. The 90° hybrid coupler 305A is configured to transmit the down converted second part of microwave signal at frequency $f_1$ with phase $-\varphi_1-90°$ to port 003, which means the 90° hybrid coupler 305A adds no phase. Destructive interference occurs at port 003 for the microwave signals transmitted from mixing devices 130_1 and 130_2. Therefore, the two microwave signals (having been received from mixing devices 130_1 and 130_2) add destructively via hybrid coupler 305A and no microwave signal is output at port 003. The constructive interference occurs at port 001, as depicted in FIG. 12.

FIG. 12 depicts operating the four-port circulator 300 when a microwave signal at frequency $f_2$ is input to port 004 (e.g., port 4) of the 180° hybrid 305B to be output at port 001 (e.g., port 1) at frequency $f_1$ according to embodiments. The microwave signal at frequency $f_2$ is received at port 004 of the 180° hybrid coupler 305B. The hybrid coupler 305B is configured to split the power of the microwave signal received at port 004. The 180° hybrid coupler 305A is configured to add a 0° phase shift to the first part (i.e., ½) of the microwave signal and transmit the first part of the microwave signal to port 322_1 of the superconducting nondegenerate three-wave mixing devices 130_1. The hybrid coupler 305B is configured to transmit the second part (i.e., ½) of the microwave signal (without a phase shift) to port 322_2 of the superconducting nondegenerate three-wave mixing device 130_2.

The first part of the microwave signal with 0° phase received at port 322_1 and the second part of microwave signal with no phase change (i.e., 0°) received at port 322_2 are both down converted from frequency $f_2$ to frequency $f_1$ by their respective mixing devices 130_1 and 130_2. Additionally, the nondegenerate three-wave mixing Josephson device 130_1 is configured to add a $-\varphi_1$ phase shift to the 0° phase of the first part of the microwave signal having been received at port 322_1, resulting in phase $-\varphi_1$. Similarly, the nondegenerate three-wave mixing Josephson device 130_2 is configured to add a $-\varphi_1-90°$ phase shift to the 0° phase of the second part of microwave signal having been received at port 322_2, resulting in phase $-\varphi_1-90°$.

The down converted first part of the microwave signal at frequency $f_1$ with phase $-\varphi_1$ is transmitted from mixing device 130_1 to the 90° hybrid coupler 305A, and the down converted second part of microwave signal at frequency $f_1$ with phase $-\varphi_1-90°$ is transmitted from mixing device 130_2 to the 90° hybrid coupler 305A. The 90° hybrid coupler 305A is configured to transmit the down converted first part of microwave signal at frequency $f_1$ with phase $-\varphi_1$ to port 001, which means the 90° hybrid coupler 305A adds no phase. After receiving the down converted second part of microwave signal at frequency $f_1$ with phase $-\varphi_1-90°$, the 90° hybrid coupler 305A is configured to add 90° phase to the phase $-\varphi_1-90°$, resulting in phase $-\varphi_1$, and transmit the up converted first part of microwave signal at frequency $f_2$ with phase $-\varphi_1$ to port 001.

Constructive interference occurs at port 001 for the microwave signals transmitted from mixing devices 130_1 and 130_2. Therefore, the two microwave signals (having been received from mixing devices 130_1 and 130_2) add constructively via hybrid coupler 305A and a combined microwave signal is output at port 001. The destructive interference occurs at port 003, as depicted in FIG. 11.

From the scenarios provided above, it should be appreciated that when a combined microwave signal is output from one output port (via constructive interference) of hybrid coupler 305A destructive interference occurs at the other output port of hybrid coupler 305A such that no signal is output. Likewise, it should be appreciated that when a combined microwave signal is output from one output port (via constructive interference) of hybrid coupler 305B destructive interference occurs at the other output port of hybrid coupler 305B such that no signal is output.

FIG. 13 depicts a flow chart 1300 of a method of forming a superconducting device 300 according to embodiments. At block 1302, a first mixing device 130_1 having a first mixing port 320_1 and a second mixing port 322_1 is provided. At block 1304, a second mixing device 130_2 having another first mixing port 320_2 and another second mixing port 322_2 is provided. The first and second mixing devices 130_1, 130_2 are superconducting nondegenerate three-wave mixing devices.

At block 1306, the first mixing port 320_1 and the another first mixing port 320_2 are coupled to a first coupler 305A.

At block 1308, the second mixing port 322_1 and the another second mixing port 322_2 are coupled to a second coupler 305B.

The first mixing device 130_1 and the second mixing device 130_1 are coupled together in parallel. The first mixing port 320_1 of the first mixing device 130_1 and the another first mixing port 320_2 of the second mixing device 130_2 are configured to have a first functionality. The first functionality can be respectively operating as Signal resonators 115A, receiving signals at frequency $f_1$, and outputting signals at frequency $f_1$.

The second mixing port 322_1 of the first mixing device 130_1 and the another second mixing port 322_2 of the second mixing device 130_2 are configured to have a second functionality. The second functionality can be respectively operating as Idler resonators 115B, receiving signals at frequency $f_1$, and outputting signals at frequency $f_1$.

The first mixing device 130_1 has a third mixing port 324_1 and the second mixing device 130_2 has another third mixing port 324_2. The third mixing port 324_1 of the first mixing device 130_1 and the another third mixing port 324_2 of the second mixing device 130_2 are configured to have a third functionality. The third functionality can be respectively receiving pump signals for operating the device in conversion mode (without photon gain) in which the applied pump frequency $f_P$ satisfies the relation $f_P=|f_1-f_S|$ or $|f_2-f_1|$, where pump signal input to port 324_1 has phase $\varphi_{p1}=\varphi_1$ and the pump signal input to port 324_2 has phase $\varphi_{p2}=\varphi_1+90°$.

The first mixing device 130_1 and the second mixing device 130_2 are configured to receive a signal from the first coupler 305A. The first mixing device 130_1 and the second mixing device 130_2 are configured to output the signal to the second coupler 305B, the signal having been converted by the first mixing device 130_1 and the second mixing device 130_2 such that the second coupler 305B is configured to output the signal via one port.

The first mixing device 130_1 and the second mixing device 130_2 are configured to receive a signal from the second coupler 305A. The first mixing device 130_1 and the second mixing device 130_2 are configured to output the signal to the first coupler 305A, the signal having been converted by the first mixing device 130_1 and the second mixing device 130_2 such that the first coupler 305A is configured to output the signal via one port.

The first coupler and the second coupler are 90 degree hybrid couplers, the first coupler is a 90 degree hybrid coupler and the second coupler is a 180 degree hybrid coupler, or the first coupler is a 180 degree hybrid coupler and the second coupler is a 90 degree hybrid coupler.

FIG. 14 depicts a flow chart 1400 of a method of forming a superconducting four-port circulator 300 according to embodiments. At block 1402, a first Josephson parametric device 130_1 having a first signal port 320_1 and a second idler port 322_1 is provided. At block 1404, a second Josephson parametric device 130_1 having another first signal port 320_2 and another second idler port 322_2, the first and second mixing devices 130_1, 130_2 being superconducting nondegenerate three-wave mixing devices.

At block 1406, the first signal port 320_1 and the another first signal port 320_2 are coupled to a first coupler 305A. At block 1408, the second idler port 322_1 and the another second idler port 322_2 are coupled to a second coupler 305B.

FIG. 15 is a flow chart 1500 of a method of operating a superconducting four-port circulator 300 according to embodiments. At block 1502, a signal is received at a port of a first coupler 305A, wherein a first Josephson parametric device 130_1 and a second Josephson parametric device 130_2 are coupled in parallel to the first coupler 305A and a second coupler 305B. At block 1504, the signal is output at a predefined port of the second coupler 305B (according to the predefined circulation pattern of the circulator 400).

The circuit elements of the circuits 330, 130_1, 130_2 can be made of superconducting material. The respective resonators and transmission/feed/pump lines are made of superconducting materials. The hybrid couplers can be made of superconducting materials. Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. The capacitors can be made of superconducting material separated by dielectric material with very low-loss. The transmission lines (i.e., wires) connecting the various elements are made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to superconducting device and integrated circuit (IC) fabrication may or may not be described in detail herein. By way of background, however, a more general description of the superconducting device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a superconductor over a dielectric (e.g., silicon) substrate, some of which are described in the immediately following paragraphs.

In general, the various processes used to form a microchip that will be packaged into an IC fall into general categories, including, film deposition, removal/etching, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Films of both conductors (e.g., poly-silicon, aluminum, copper, etc.) and insulators (e.g., various forms of silicon dioxide, silicon nitride, etc.) are used to connect and isolate components. Lithography is the formation of three-dimensional relief images or patterns on the semiconductor substrate for subsequent transfer of the pattern to the substrate. In lithography, the patterns are formed by a light sensitive polymer called a photo-resist. To build the complex structures of a circuit, lithography and etch pattern transfer steps are repeated multiple times. Each pattern being printed on the wafer is aligned to the previously formed patterns and slowly the conductors, insulators and other regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A superconducting device comprising:
   a first device comprising at least one Josephson junction, the first device having a first port, a second port, and a pump port; and
   a second device having another first port, another second port, and another pump port, the first port and the another first port being associated by wave interference, the second port and the another second port being associated by the wave interference, the wave interference being configured based on a difference associated with the pump port and the another pump port.

2. The superconducting device of claim 1, wherein the first device and the second device are coupled in parallel.

3. The superconducting device of claim 1, wherein the first port and the another first port are configured to couple to a first coupler.

4. The superconducting device of claim 3, wherein the second port and the another second port are configured to couple to a second coupler.

5. The superconducting device of claim 1, wherein the first port of the first device and the another first port of the second device are configured to have a first functionality.

6. The superconducting device of claim 5, wherein the second port of the first device and the another second port of the second device are configured to have a second functionality.

7. The superconducting device of claim 1, wherein the second device comprises another at least one Josephson junction.

8. The superconducting device of claim 1, wherein the first device comprises a first resonator.

9. The superconducting device of claim 8, wherein the second device comprises a second resonator.

10. The superconducting device of claim 9, wherein the first and second resonators are configured to interact.

11. A superconducting device comprising:
    a first coupler;
    a second coupler;
    a first device comprising a first part, a second part, and a pump port; and
    a second device comprising another first part, another second part, and another pump port, the first part and the another first part being coupled to the first coupler and associated by wave interference, the second part and the another second part being coupled to the second coupler and associated by the wave interference, the wave interference being based on a difference associated with the pump port and the another pump port.

12. The superconducting device of claim 11, wherein a combination of the first coupler and the second coupler comprises input/output ports.

13. The superconducting device of claim 12, wherein input of a signal in one of the input/output ports is configured to be blocked from output through another one of the input/output ports according to wave interference.

14. The superconducting device of claim 12, wherein input of a signal in one of the input/output ports is configured to pass as output through another one of the input/output ports according to wave interference.

15. The superconducting device of claim 11, wherein a combination of the first coupler, the second coupler, the first device, and the second device are configured to pass a signal or block the signal according to wave interference.

16. The superconducting device of claim 11, wherein the first part and the another first part have an analogous functionality.

17. The superconducting device of claim 11, wherein the second part and the another second part have an analogous functionality.

18. The superconducting device of claim 11, wherein the first coupler and the second coupler are hybrid couplers.

19. The superconducting device of claim 11, wherein the first device comprises at least one Josephson junction.

20. The superconducting device of claim 11, wherein the second device comprises at least one Josephson junction.

* * * * *